United States Patent
Chatani et al.

(10) Patent No.: US 10,494,709 B2
(45) Date of Patent: Dec. 3, 2019

(54) THIN FILM FORMING METHOD

(71) Applicant: MURATA MANUFACTURING CO., LTD., Kyoto-fu (JP)

(72) Inventors: Munehito Chatani, Nagaokakyo (JP); Hitoshi Seki, Nagaokakyo (JP); Atsushi Mori, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 243 days.

(21) Appl. No.: 14/958,138

(22) Filed: Dec. 3, 2015

(65) Prior Publication Data
US 2016/0083832 A1    Mar. 24, 2016

Related U.S. Application Data

(63) Continuation of application No. PCT/JP2014/063317, filed on May 20, 2014.

(30) Foreign Application Priority Data

Jun. 4, 2013   (JP) ................. 2013-118147

(51) Int. Cl.
*C23C 14/00* (2006.01)
*H01J 37/34* (2006.01)

(52) U.S. Cl.
CPC ...... *C23C 14/0042* (2013.01); *C23C 14/0063* (2013.01); *C23C 14/0094* (2013.01); *H01J 37/3485* (2013.01)

(58) Field of Classification Search
CPC ............ C23C 14/0042; C23C 14/0063; C23C 14/0094; H01J 37/3485
See application file for complete search history.

(56) References Cited

U.S. PATENT DOCUMENTS

| | | | | |
|---|---|---|---|---|
| 4,166,784 A | * | 9/1979 | Chapin | ............... C23C 14/0042 |
| | | | | 118/665 |
| 4,201,645 A | * | 5/1980 | Riegert | ................... C23C 14/54 |
| | | | | 204/192.12 |

(Continued)

FOREIGN PATENT DOCUMENTS

| JP | H05-78836 A | 3/1993 |
|---|---|---|
| JP | 2000-026967 A | 1/2000 |

(Continued)

OTHER PUBLICATIONS

International Search Report—PCT/JP2014/063317 dated Aug. 12, 2014.
Written Opinion—PCT/JP2014/063317 dated Aug. 12, 2014.

*Primary Examiner* — Michael A Band
(74) *Attorney, Agent, or Firm* — Studebaker & Brackett PC

(57) ABSTRACT

A compound thin film is obtained with a high deposition rate and consistent film quality in reactive sputtering. A thin film is formed by performing voltage monitoring control and gas flow rate monitoring control. The voltage monitoring control is control in which a gas flow rate is adjusted such that the value of a target voltage is brought closer to the value of a desired voltage by monitoring the target voltage in a first cycle time. The gas flow rate monitoring control is control in which the desired voltage for the target voltage is changed such that the value of the gas flow rate is brought closer to the value of a desired gas flow rate by monitoring the gas flow rate in a second cycle time.

1 Claim, 9 Drawing Sheets

(56) References Cited

U.S. PATENT DOCUMENTS

| | | | |
|---|---|---|---|
| 5,292,417 A * | 3/1994 | Kugler | C23C 14/0042 |
| | | | 204/192.12 |
| 5,556,520 A | 9/1996 | Latz | |
| 6,106,676 A | 8/2000 | Terry et al. | |
| 8,053,364 B2 * | 11/2011 | French | C23C 14/0042 |
| | | | 204/298.01 |
| 8,163,140 B2 * | 4/2012 | Ikari | C23C 14/0036 |
| | | | 204/192.13 |
| 9,562,283 B2 * | 2/2017 | Gibson | C23C 14/0078 |
| 2005/0205413 A1 | 9/2005 | Ikari et al. | |
| 2014/0311892 A1 * | 10/2014 | Krassnitzer | H01J 37/3467 |
| | | | 204/192.11 |

FOREIGN PATENT DOCUMENTS

| | | |
|---|---|---|
| JP | 2003-342725 A | 12/2003 |
| JP | 2006-124811 A | 5/2006 |
| JP | 2007-063623 A | 3/2007 |

* cited by examiner

THIN FILM FORMING METHOD

CROSS REFERENCE TO RELATED APPLICATIONS

This application claims benefit of priority to Japanese Patent Application 2013-118147 filed Jun. 4, 2013, and to International Patent Application No. PCT/JP2014/063317 filed May 20, 2014, the entire content of which is incorporated herein by reference.

TECHNICAL FIELD

The present disclosure relates to a thin film forming method for forming a thin film on a substrate by using a reactive sputtering device, and in particular relates to a thin film forming method in which reactive sputtering is performed in a transition mode (transition region) when forming a thin film.

BACKGROUND

As an example of a device for forming a compound thin film such as one composed of an oxide or a nitride on a substrate, a reactive sputtering device 110 illustrated in FIG. 1 is known. The reactive sputtering device 110 includes a vacuum chamber 111, a metal target 113 provided inside the vacuum chamber 111 and a power supply 112 that supplies constant power to the metal target 113. A substrate 50 is arranged at a position facing the metal target 113 inside the vacuum chamber 111. The inside of the vacuum chamber 111 is evacuated using a vacuum pump 121, a non-reactive gas is introduced via a non-reactive gas introduction valve 116 and a reactive gas is introduced via a reactive gas introduction valve 115. The pressure inside the vacuum chamber 111 is maintained at a certain pressure by an automatic pressure adjustment valve 122 provided between the vacuum chamber 111 and the vacuum pump 121.

FIGS. 2 and 3 are diagrams for explaining the deposition mode in reactive sputtering and illustrate the relationship between the absolute value of a target voltage V applied to the metal target and a gas flow rate Q of a reactive gas introduced into the inside of the vacuum chamber. The flow rate of a non-reactive gas introduced into the inside of the vacuum chamber is constant. There are a metal mode M, a compound mode C and a transition mode T within the deposition mode in reactive sputtering.

FIG. 2 illustrates that the target voltage V changes as indicated by the solid line arrows when the gas flow rate Q is gradually increased, or the target voltage V changes as indicated by the broken line arrows when the gas flow rate Q is gradually decreased. Thus, the gas flow rate Q and the target voltage V in reactive sputtering have a hysteresis characteristic.

FIG. 3 illustrates the relationship between the gas flow rate Q and the target voltage V in the case where the gas flow rate Q is controlled in order to control the target voltage V to be constant. Although there are fluctuations in the gas flow rate Q and the target voltage V in reality, the gas flow rate Q and the target voltage V are illustrated as a curved line such as the deposition mode curve D1 by plotting average values of the gas flow rate Q and the target voltage V. When forming a thin film, sputtering is performed using any of deposition conditions located along the deposition mode curve D1.

The transition mode T along the deposition mode curve D1 is located between the metal mode M and the compound mode C and is a mode in which a compound thin film can be formed on the substrate 50 while maintaining an eroded portion of the metal target 113 in a metal state. Consequently, the transition mode T has both the strong points of having a deposition rate that is close to that of the metal mode M and of being able to form a compound thin film with a composition close to that in the compound mode C. However, the transition mode T also tends to easily change to the metal mode M or the compound mode C with a change in the discharge state inside the vacuum chamber. Therefore, in order to maintain the transition mode T when forming a thin film, impedance control in which the target voltage V is maintained constant is typically performed.

In addition, in embodiment 9 of Japanese Unexamined Patent Application Publication No. 2007-63623, a finding is disclosed regarding the relationship between a discharge voltage and a partial pressure of a reactive gas (O2 gas) inside a vacuum chamber. According to this finding, reactive sputtering using the transition mode T can be maintained by setting the discharge voltage and the partial pressure of the reactive gas so as to be within a certain range (plateau region).

SUMMARY

Technical Problem

It is known that when sputtering is performed for a long period of time using constant power control, the absolute value of the target voltage V becomes smaller due to erosion of the metal target. In relation to this, the inventors confirmed that the position of the deposition mode curve D1 shifts in the direction of an arrow SH1 (downward) over time as illustrated in FIG. 4. Since the above-mentioned impedance control is performed in order to maintain the target voltage V constant, it turns out that sputtering will be performed at deposition conditions in the order of points A1, A2 and A3 based on the deposition mode curve D1 illustrated in FIG. 4. However, if the target voltage V remains constant from the beginning to the end of the sputtering, the deposition mode will shift from the transition mode T to the metal mode M due to the deposition mode curve D1 shifting downward. Consequently, the film quality of a compound thin film formed on the substrate 50 may vary if just impedance control is simply performed.

In addition, even assuming that sputtering is performed while remaining in the transition mode T, the percentage content of the compound within the compound thin film after the formation of the thin film subtly varies under deposition conditions close to the metal mode M, deposition conditions close to the compound mode C and deposition conditions in the center of the transition mode T. Regarding this, although the finding regarding performance of sputtering inside a region of the transition mode T is described in Japanese Unexamined Patent Application No. 2007-63623, varying of the percentage content of the compound within the compound thin film with the deposition conditions within the range of the transition mode T is not considered. In addition, in Japanese Unexamined Patent Application No. 2007-63623, there is no specific description regarding how to cause the discharge voltage and the partial pressure of reactive gas to be located in specific regions, in reactive sputtering in which the discharge state is liable to change.

An object of the present disclosure is to provide a thin film forming method for forming a compound thin film that has a high deposition rate and consistent film quality by solving these issues.

Solution to Problem

Thin film forming methods according to a first aspect and a second aspect of the present disclosure will be described below.

A thin film forming method according to the first aspect of the present disclosure is a method for forming a thin film on a substrate arranged inside a vacuum chamber by using a reactive sputtering device including the vacuum chamber, a metal target provided inside the vacuum chamber, a power supply that supplies constant power to the metal target and a reactive gas introduction valve that adjusts a gas flow rate of a reactive gas introduced into the inside of the vacuum chamber, in which, in order to perform sputtering during formation of a thin film in a transition mode that lies between a metal mode and a compound mode, voltage monitoring control is executed in which the gas flow rate is adjusted so that a value of a target voltage applied to the metal target is brought closer to a value of a desired voltage by monitoring the target voltage in a first cycle time, and gas flow rate monitoring control is executed in which the desired voltage for the target voltage is changed every end time of a second cycle time such that a value of the gas flow rate is brought closer to a value of a desired gas flow rate by monitoring the gas flow rate in the second cycle time, which is longer than the first cycle time.

It is preferable that the value of the gas flow rate be a running average of the gas flow rate monitored in the second cycle time.

A thin film forming method according to the second aspect of the present disclosure is a method for forming a thin film on a substrate arranged inside a vacuum chamber by using a reactive sputtering device including the vacuum chamber, a metal target arranged inside the vacuum chamber, a power supply that supplies constant power to the metal target and a reactive gas introduction valve that adjusts a gas flow rate of a reactive gas introduced into the inside of the vacuum chamber, in which, in order to perform sputtering during formation of a thin film in a transition mode that lies between a metal mode and a compound mode, current monitoring control is executed in which the gas flow rate is adjusted such that a value of a target current supplied to the metal target is brought closer to a value of a desired current by monitoring the target current in a certain cycle time, and gas flow rate monitoring control is executed in which the desired current for the target current is changed at each end time of another cycle time such that a value of the gas flow rate is brought closer to a value of the desired gas flow rate by monitoring the gas flow rate in the other cycle time, which is longer than the certain cycle time.

It is preferable that the value of the gas flow rate be a running average of the gas flow rate monitored in the other cycle time.

Advantageous Effects of Disclosure

According to the first aspect of the present disclosure, the gas flow rate is adjusted such that the value of the target voltage is brought closer to the value of the desired voltage by monitoring the voltage in the first cycle time, and the desired voltage for the target voltage is changed such that the value of the gas flow rate is brought closer to the value of the desired gas flow rate by monitoring the gas flow rate in the second cycle time. Thus, as well as it being possible to perform sputtering in the transition mode with certainty, it is possible to maintain a certain sputtering state within the transition mode. As a result, a compound thin film can be formed with a high deposition rate and consistent film quality.

According to the second aspect of the present disclosure, the gas flow rate is adjusted such that the value of the target current is brought closer to the value of the desired current by monitoring the current in the certain cycle time, and the desired current of the target current is changed such that the value of the gas flow rate is brought closer to the value of the desired gas flow rate by monitoring the gas flow rate in the other cycle time. Thus, as well as it being possible to perform sputtering in the transition mode with certainty, it is possible to maintain a certain sputtering state within the transition mode. As a result, a compound thin film can be formed with a high deposition rate and consistent film quality.

DETAILED DESCRIPTION

First Embodiment

Figure 5:
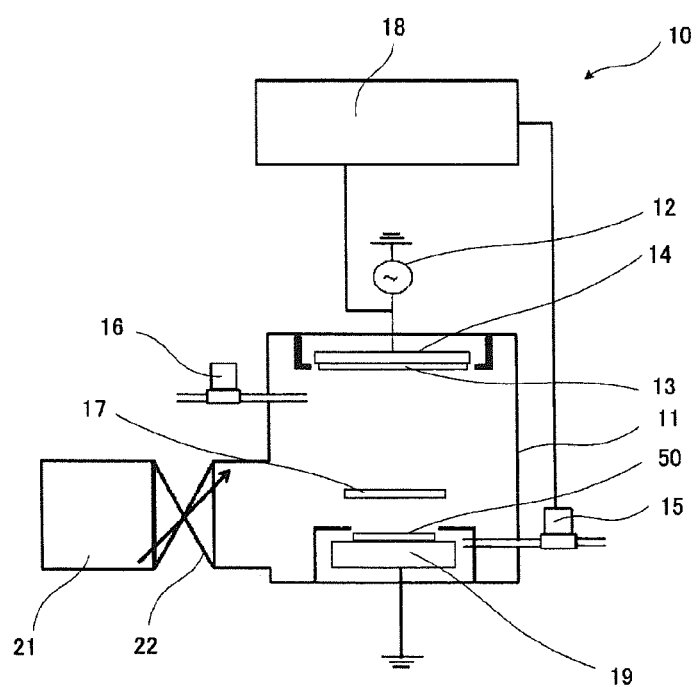
FIG. 5 is a front view of a reactive sputtering device used in a thin film forming method according to a first embodiment of the present disclosure.

FIG. 5 illustrates a reactive sputtering device 10 used in a thin film forming method according to a first embodiment of the present disclosure. The reactive sputtering device 10 includes a vacuum chamber 11, a metal target 13 provided inside the vacuum chamber 11, a power supply 12 that supplies constant power to the metal target 13, and a reactive gas introduction valve 15 that adjusts the flow rate of a reactive gas introduced into the inside of the vacuum chamber 11. The inside of the vacuum chamber 11 is evacuated using a vacuum pump 21, a non-reactive gas is introduced via a non-reactive gas introduction valve 16 and a reactive gas is introduced via the reactive gas introduction valve 15. The pressure inside the vacuum chamber 11 is maintained at a certain pressure by an automatic pressure adjustment valve 22 provided between the vacuum chamber 11 and the vacuum pump 21.

For example, Ar gas is used as the non-reactive gas and O2 gas, N2 gas or the like is used as the reactive gas. The reactive gas introduction valve 15 has a function of adjusting the gas flow rate and is connected to a control device 18. The control device 18 monitors the gas flow rate of the reactive gas and controls opening and closing of the reactive gas introduction valve 15. The metal target 13 is disposed on a target fixing stand 14. Si, Al, Ti and so forth are examples of the material of the metal target 13. A magnetron, which is not illustrated, is built into the target fixing stand 14.

A substrate 50 is disposed so as to face the metal target 13 inside the vacuum chamber 11. The substrate 50 is disposed on a substrate fixing stand 19. A shutter 17, which is for temporarily preventing deposition of a film on the substrate 50, is provided between the metal target 13 and the substrate 50. The shutter 17 is opened and closed by a driving mechanism, which is not illustrated.

The metal target 13 is connected to the power supply 12 via the target fixing stand 14 and the substrate 50 is connected to earth for example via the substrate fixing stand 19. The power supply 12 is a constant power supply for making the power supplied to the metal target 13 constant and is connected to the control device 18. The control device 18 monitors the target voltage V through the power supply 12. A high potential difference is generated between the metal target 13 and an anode connected to earth by the power supply 12 and the metal target is sputtered. The power supply 12 may be a direct-current power supply or may be a high-frequency power supply.

A thin film forming method in which this reactive sputtering device 10 is used will be described. First, the general flow of the process of forming a thin film on the substrate 50 will be described sequentially with the following steps S1 to S10.

S1: The inside of the vacuum chamber 11 is evacuated using the vacuum pump 21 and the pressure inside the vacuum chamber 11 is made to be a negative pressure. The pressure at this time is for example $1.0 \times 10^{-3}$ Pa.

S2: The substrate 50 is placed inside the vacuum chamber 11.

S3: Ar gas is introduced as a non-reactive gas and O2 is introduced as a reactive gas into the inside of the vacuum chamber 11.

S4: The pressure inside the vacuum chamber 11 is made to be a certain pressure by the automatic pressure adjustment valve 22. The certain pressure at this time is for example 1.0 Pa.

S5: When pre-sputtering is to be performed, the shutter 17 is closed in order to prevent a film being deposited on the substrate 50.

S6: A voltage is applied to the metal target 13 by turning the power supply 12 on and pre-sputtering is started in the metal mode M. Impurities and so forth adhered to the surface of the metal target 13 are removed by the pre-sputtering. The reason why pre-sputtering is started in the metal mode M is that it is difficult to immediately generate a discharge in the transition mode T. Pre-sputtering may be started in the compound mode C instead.

S7: The target voltage V applied to the metal target 13 is changed such that the deposition mode when forming a thin film will be the transition mode T and the process transitions to sputtering in the transition mode T. At this time, impedance control is performed and the gas flow rate Q of the reactive gas is adjusted such that the target voltage V falls within a desired range. The flow rate of the non-reactive gas is constant.

S8: Once the period for pre-sputtering has passed, the shutter 17 is opened.

S9: After S8, formation of a thin film on the substrate 50 is started. At this time, as well as the gas flow rate Q being changed on a short-term basis as described in step S7, an index of the target voltage V (desired voltage) is also changed such that the gas flow rate Q remains within a certain threshold over a long period of time.

S10: The shutter 17 is closed once a preset period for forming the thin film has passed.

A thin film is formed on the substrate 50 using the above-described steps S1 to S10. Among the steps S1 to S10, the characteristics of the thin film forming method according to the first embodiment are found in step S9.

Figure 6:
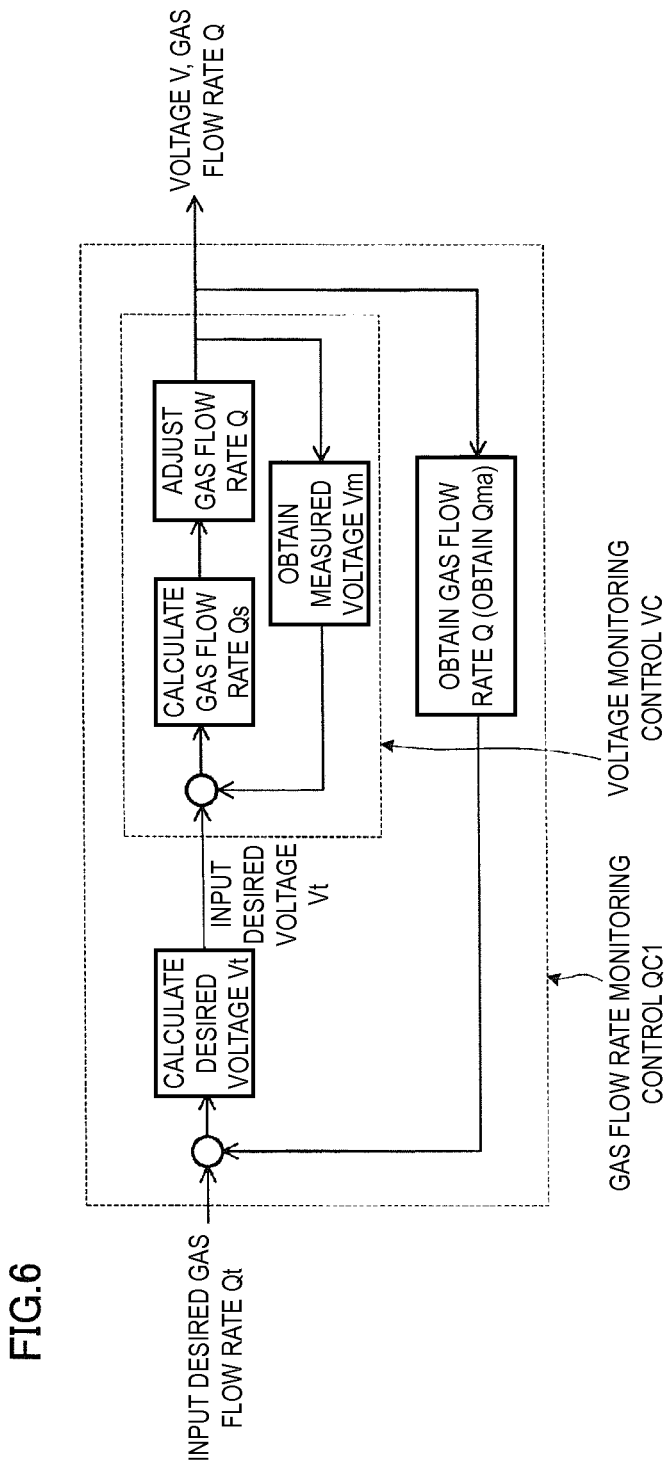
FIG. 6 is a block diagram for explaining the thin film forming method according to the first embodiment of the present disclosure.

FIG. 6 is a block diagram for describing step S9 in further detail. The thin film forming method performed in step S9 includes voltage monitoring control VC and gas flow rate monitoring control QC1 as illustrated in FIG. 6.

The voltage monitoring control VC is control in which the gas flow rate Q is adjusted such that the value of the target voltage V is brought closer to the value of a desired voltage Vt. The transition mode T when forming a thin film is an unstable discharge state and therefore the target voltage V continuously changes. The relationship illustrated in FIG. 2 exists between the gas flow rate Q and the target voltage V and therefore the target voltage V can be changed by changing the gas flow rate Q.

In the voltage monitoring control VC, first, an input desired voltage Vt and a fed back measured voltage Vm are compared. The desired voltage Vt is an index of the target voltage V for performing thin film formation in the transition mode T and is initially set by obtaining in advance data on the target voltage V in the transition mode T. The measured voltage Vm is a measured value obtained by monitoring the target voltage V when the reactive sputtering device 10 is made to operate.

Figure 1:
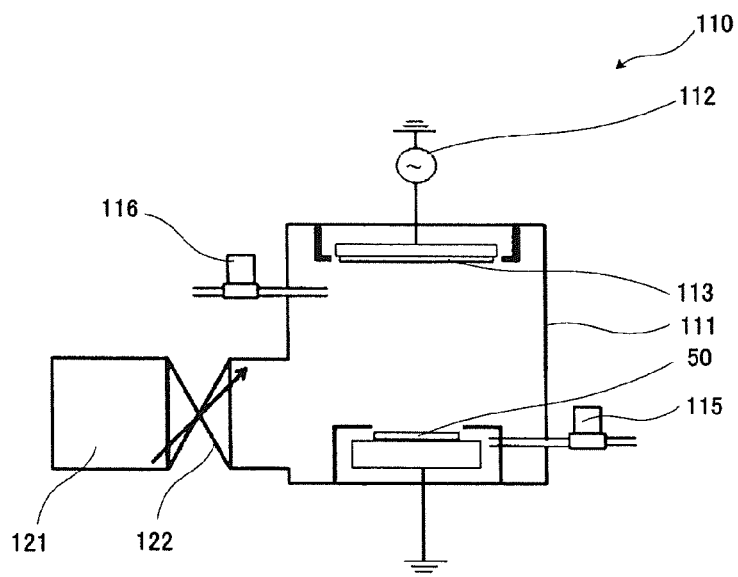
FIG. 1 is a front view of a typical reactive sputtering device 110.
Figure 2:
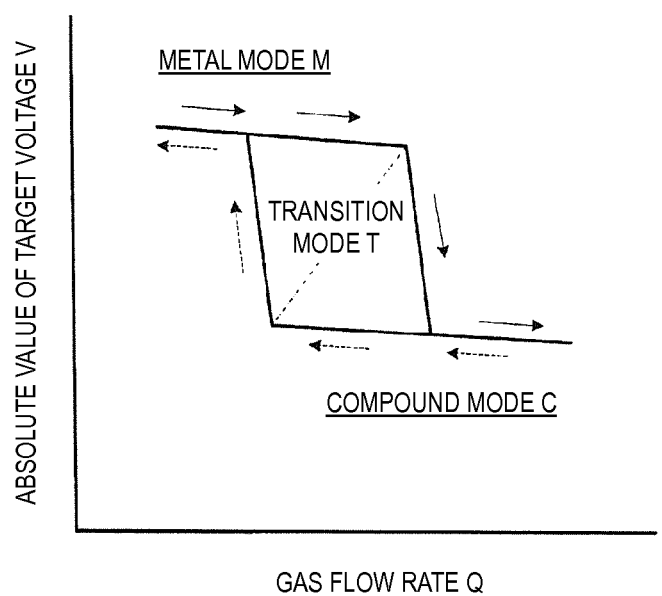
FIG. 2 is a first diagram for explaining a deposition mode in reactive sputtering.

Next, a calculated gas flow rate Qs is calculated in accordance with the difference between the desired voltage Vt and the measured voltage Vm. As illustrated in FIG. 2, when the gas flow rate Q is caused to increase, the absolute value of the target voltage V becomes smaller and when the gas flow rate Q is caused to decrease, the absolute value of the target voltage V becomes larger. Therefore the calculated gas flow rate Qs is calculated such that the actual gas flow rate Q is caused to increase when the measured voltage Vm is larger than the desired voltage Vt and the actual gas flow rate Q is caused to decrease when the measured voltage Vm is smaller than the desired voltage Vt. For example, proportional integral differential control (PID control) is adopted in the calculation of the gas flow rate Qs.

Figure 3:
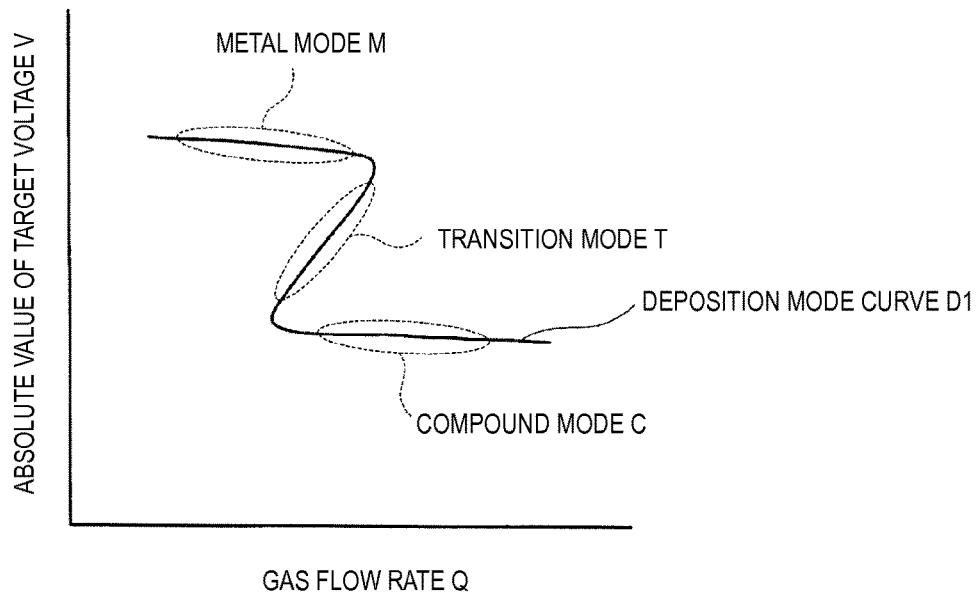
FIG. 3 is a second diagram for explaining a deposition mode in reactive sputtering.
Figure 4:
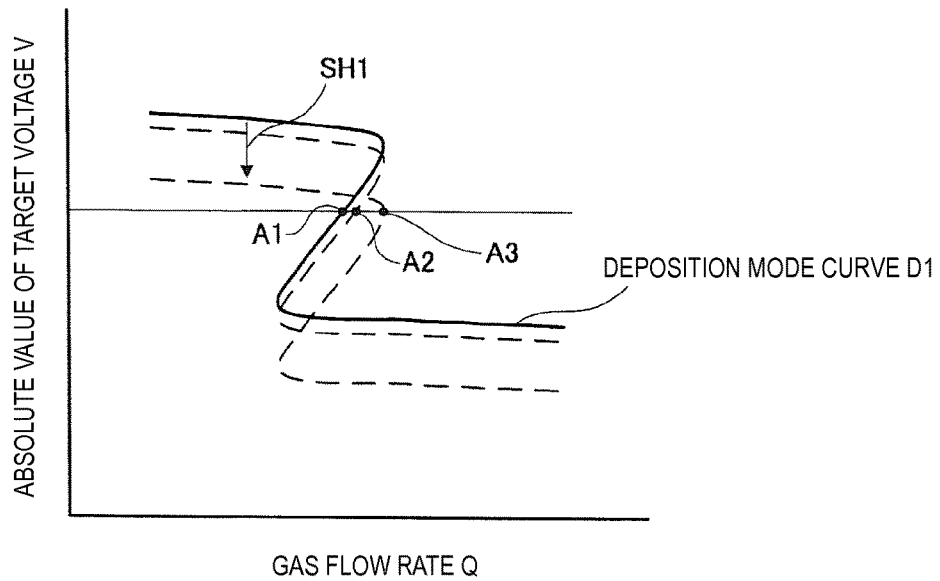
FIG. 4 illustrates a case in which the position of a deposition mode curve D1 illustrated in FIG. 3 is shifted downward with continuation of sputtering.

The reactive gas introduction valve 15 is opened and closed in accordance with the obtained calculated gas flow rate Qs and the gas flow rate Q of the reactive gas introduced into the vacuum chamber 11 is thus adjusted. By adjusting the gas flow rate Q, the value of the target voltage V is controlled so as to be brought closer to the value of the desired voltage Vt. In addition, the target voltage V, which is the output of the voltage monitoring control VC, is monitored, fed back as the measured voltage Vm and compared with the desired voltage Vt. By repeatedly performing these steps, the target voltage V is maintained in a certain range and sputtering in the transition mode T is performed with certainty. The gas flow rate Q and the target voltage V fluctuate in reality, but control is performed in the transition mode T of the deposition mode curve D1 illustrated in FIG. 3 by taking the average values of the gas flow rate Q and the target voltage V.

A cycle time in which the voltage monitoring control VC is executed is extremely short and is for example 0.1 seconds. The voltage monitoring control VC is repeated a plurality of times continuously, and each time, control is performed so that the value of the target voltage V is brought closer to the value of the desired voltage Vt. Hereafter, the cycle time in which the voltage monitoring control VC is executed will be referred to as a "first cycle time tv" (refer to FIG. 10 and FIG. 11).

The gas flow rate monitoring control QC1 is control in which the desired voltage Vt for the target voltage V is changed so that the value of the gas flow rate Q is brought closer to the value of a desired gas flow rate Qt. As described above, by executing the voltage monitoring control VC every first cycle time tv, control is performed so that the value of the target voltage V is maintained at the value of the desired voltage Vt. However, since the deposition mode curve D1 shifts over time in a direction in which the target voltage V decreases, if the desired voltage Vt remains fixed for a long time, the deposition mode will change to the part of the transition mode T having deposition conditions close to those of the metal mode M. Consequently, in order to maintain a certain sputtering state within the transition mode T, control is performed in which the desired voltage Vt is appropriately changed by monitoring the gas flow rate Q.

The cycle time in which the gas flow rate monitoring control QC1 is executed is appropriately set so as to be longer than the first cycle time tv and is for example between several tens of seconds and several hours. Hereafter, the cycle time in which the gas flow rate monitoring control QC1 is executed will be referred to as a "second cycle time tq1". The gas flow rate monitoring control QC1 is performed at every end time t1 and t2 of the second cycle time tq1 (refer to FIG. 10 and FIG. 11). The end time of the cycle time may be at the end of the cycle time, at the start of the cycle time or at a time between the end of the cycle time and the start of the next cycle time.

In the gas flow rate monitoring control QC1, first, the value of the input desired gas flow rate Qt and the value of the fed back gas flow rate Q are compared.

The desired gas flow rate Qt is a gas flow rate Q to be used when performing thin film formation in the transition mode T and is set by obtaining in advance data on the gas flow rate Q in the transition mode T. The desired gas flow rate Qt is set to an appropriate value in order to obtain the desired film quality, and is preferably set to a fixed value in order to obtain a uniform film quality.

Specifically, the fed back gas flow rate Q is a running average Qma of the gas flow rate monitored in the second cycle time tq1. The running average Qma of the gas flow rate is obtained by averaging the most recent values of the gas flow rate Q. The period in which the running average Qma of the gas flow rate is obtained is longer than the first cycle time tv and is preferably shorter than the second cycle time tq1. Hereafter, the period in which the running average Qma of the gas flow rate is obtained will be referred to as "running average time ta".

Figure 10:
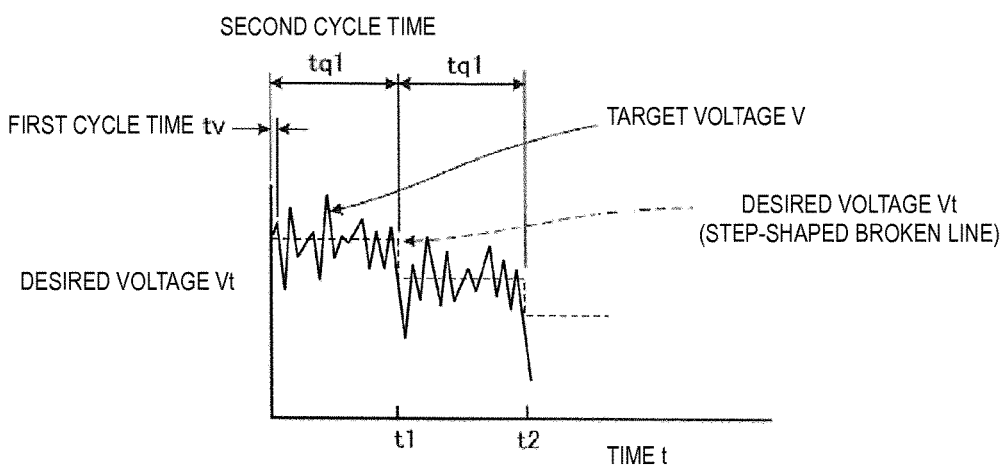
FIG. 10 is a first diagram illustrating changes in the target voltage Vt over a shorter period of time than in FIG. 9.
Figure 11:
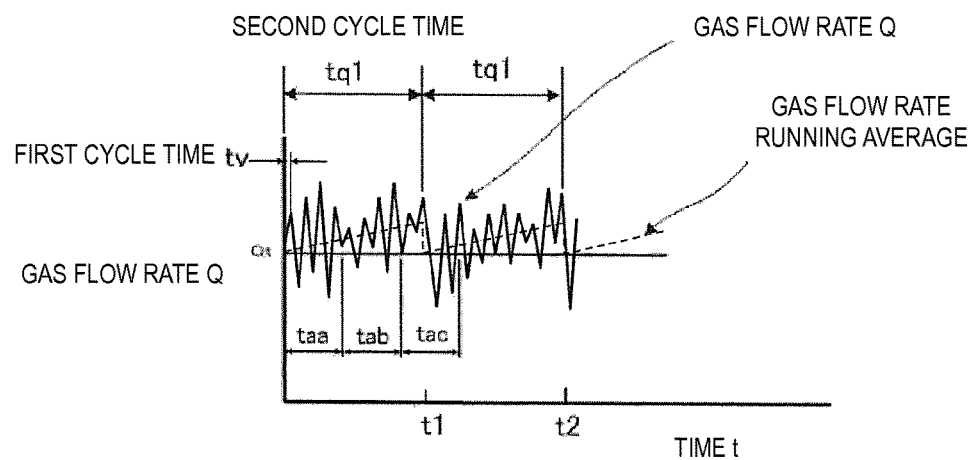
FIG. 11 is a second diagram illustrating changes in the gas flow rate Q over a shorter period of time than in FIG. 9.

The first cycle time tv, the second cycle time tq1 and the running average time (ta) are illustrated in FIG. 10 and FIG. 11. In addition, running average times taa, tab and tac are illustrated as specific examples of the running average time (ta). The running average Qma of the gas flow rate is for example obtained by averaging the gas flow rate Q in the running average time tab. Thus, by periodically feeding back the gas flow rate Q or the running average Qma of the gas flow rate, it is possible to perform thin film formation that is in accordance with an erosion state of the metal target 13 and it is possible to maintain a certain sputtering state.

Next, the desired voltage Vt is calculated in accordance with the difference between the desired gas flow rate Qt and the gas flow rate Q. The desired voltage Vt is calculated such that the value of the gas flow rate Q will be brought closer to the value of the desired gas flow rate Qt. Specifically, after using the running average Qma of the gas flow rate as the gas flow rate Q, the desired voltage Vt is calculated so as to become smaller than its current value if the running average Qma of the gas flow rate is larger than the desired gas flow rate Qt and so as to become larger than its current value if the running average Qma of the gas flow rate is smaller than the desired gas flow rate Qt. However, since the deposition mode curve D1 shifts downward when viewed over a long period of time, the desired voltage Vt is calculated so as to become smaller with the passage of time. PID control is adopted in the calculation of the desired voltage Vt as well.

The obtained desired voltage Vt is input to the voltage monitoring control VC indicated by the broken line and as a result the value of the initially set desired voltage Vt is changed. The above-described voltage monitoring control VC is executed on the basis of the changed desired voltage Vt. In addition, when the gas flow rate Q has shifted from the desired gas flow rate Qt, the desired voltage Vt is corrected by the gas flow rate monitoring control QC1. By repeatedly performing these steps, sputtering in the transition mode T is performed with certainty and thin film formation is performed in a certain sputtering state within the transition mode T.

Figure 7:
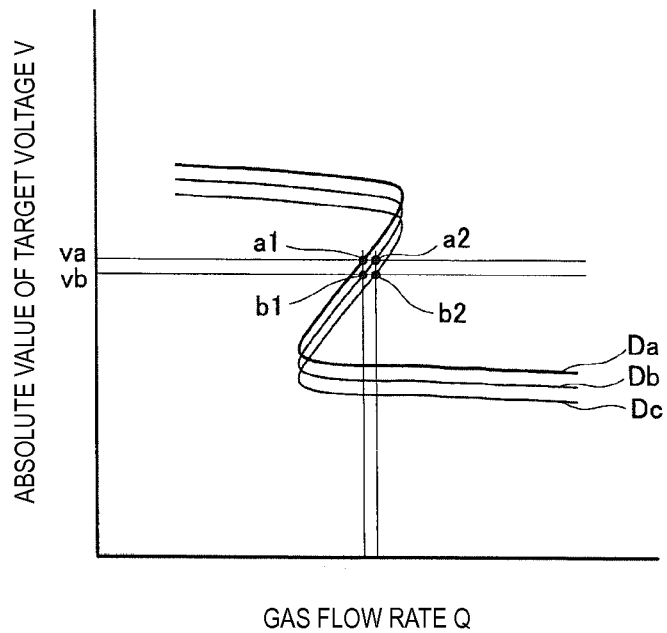
FIG. 7 is a conceptual diagram illustrating changes in deposition mode when the thin film forming method illustrated in FIG. 6 is carried out.

Next, referring to FIG. 7, description will be given of changes that occur in the deposition mode when the voltage monitoring control VC and the gas flow rate monitoring control QC1 are executed. FIG. 7 conceptually illustrates changes in the deposition mode over a short period of time. The short period of time referred to here is a period of time in which the gas flow rate monitoring control QC1 is executed several times and for example is between 2 and 20 seconds. In this period of time, the deposition mode curve D1 shifts from a deposition mode curve Da to a deposition mode curve Db, and from the deposition mode curve Db to the deposition mode curve Dc in this order. Points a1, a2, b1 and b2 on the deposition mode curves Da, Db and Dc indicate deposition conditions (target voltage V and gas flow rate Q) for maintaining a certain sputtering state within the transition mode T.

The change in deposition conditions when the deposition mode curve shifts from the deposition mode curve Da to the deposition mode curve Db is as follows. First, voltage monitoring control VC is executed using the deposition conditions represented by the point a1 on the deposition mode curve Da as a basis. In the voltage monitoring control VC, a target voltage va is maintained constant by causing the average value of the gas flow rate Q to increase. Through this control, the deposition conditions shift from the point a1 to the point a2 on the deposition mode curve Db.

If the target voltage va were to remain constant, the deposition conditions would become greatly shifted from the initially set certain sputtering state. Accordingly, once the second cycle time tq1 has elapsed, the gas flow rate monitoring control QC1 is executed for the deposition conditions represented by the point a2. At this time, the desired target voltage V decreases to the target voltage vb from the target voltage va. The value of the target voltage vb is determined using PID control. With this control, the deposition conditions shift from the point a2 to a point b1. The position of the point b1 on the deposition mode curve Db is substantially the same as the position of the point a1 on the deposition mode curve Da and therefore the certain sputtering state lying within the transition mode T is maintained.

The deposition conditions similarly change when the deposition mode curve shifts from the deposition mode curve Db to the deposition mode curve Dc and the voltage monitoring control VC is executed using the point b1 as a basis and the deposition conditions are shifted to the point b2. Thus, although the deposition mode curve D changes over time, by repeatedly executing the voltage monitoring control VC and the gas flow rate monitoring control QC1, sputtering in the transition mode T is performed with certainty and thin film formation is performed in a certain sputtering state within the transition mode T.

In order to enable a better understanding, the changes that occur in the desired voltage Vt and the gas flow rate Q will be described from the viewpoints of a long period of time and a short period of time.

Figure 8:
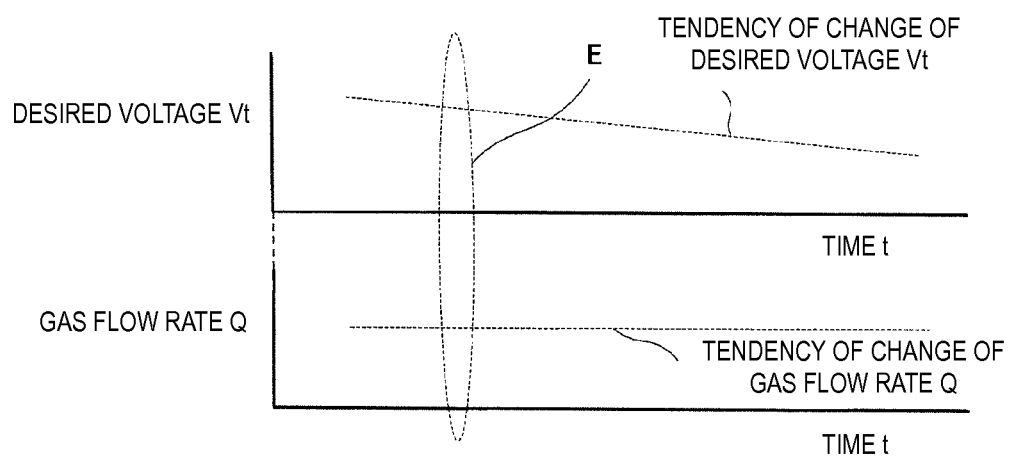
FIG. 8 illustrates the trends of changes in a target voltage Vt and a gas flow rate Q over a long period of time.

FIG. 8 illustrates the trends of changes in a target voltage Vt and a gas flow rate Q over a long period of time. The long period of time referred to here is a period of time in which the metal target 13 is continuously used and is for example 1 hour or more. When viewed over a long period of time, the trend of change in the running average of the gas flow rate is constant. The trend of the change in the desired voltage Vt is downward and to the right.

Figure 9:
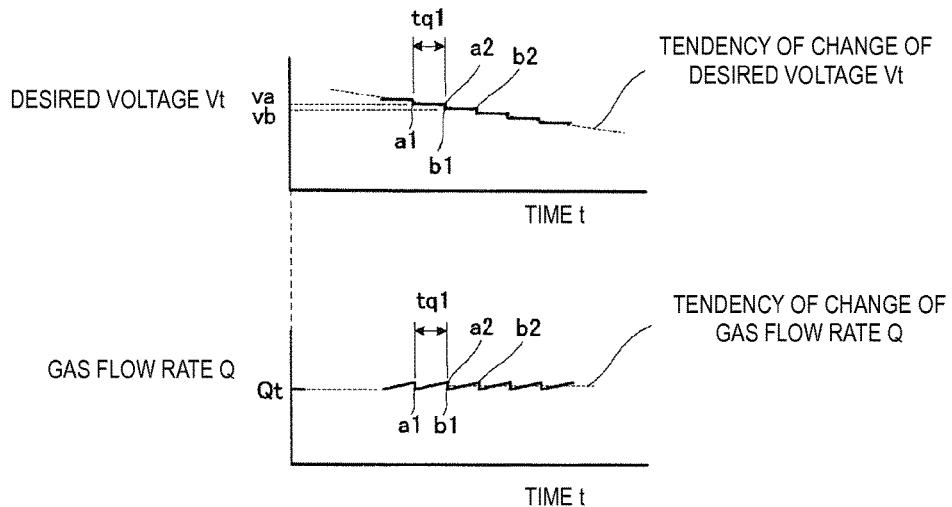
FIG. 9 illustrates the trends of changes in the target voltage Vt and the gas flow rate Q over a short period of time.

FIG. 9 illustrates the changes in the desired voltage Vt and the gas flow rate Q over a short period of time and illustrates a part E of FIG. 8 in an enlarged manner. The short period of time referred to here is a period of time in which the gas flow rate monitoring control QC1 is executed several times and for example is between 2 and 20 seconds. Slight tremors actually measured in the gas flow rate Q are cut off. In addition, in FIG. 9, the deposition conditions at the points a1, a2, b1 and b2 illustrated in FIG. 7 are indicated.

In FIG. 9, the desired voltage va is constant as time passes from point a1 to point a2 due to execution of the voltage monitoring control VC. At the time of the shift from the point a2 to the point b1, the gas flow rate monitoring control QC1 is executed and as a result, the desired voltage Vt changes smaller from the desired voltage va to the desired voltage vb instantaneously. The desired voltage vb is constant as time passes from the point b1 to the point b2. As a result of these steps being repeated, the desired voltage Vt becomes smaller in a stepwise manner.

The gas flow rate Q gradually becomes larger as time passes from the point a1 to the point a2 as a result of the voltage monitoring control VC being executed. At the time of the shift from the point a2 to the point b1, the gas flow rate instantaneously becomes smaller due to the gas flow rate monitoring control QC1 being executed. The gas flow rate Q gradually becomes larger as time passes from the point b1 to the point b2. As a result of these steps being repeated, the gas flow rate Q changes with a saw-tooth wave pattern. Also from FIG. 9, it is clear that the value of the gas flow rate Q changes so as to become closer to the value of the desired gas flow rate Qt at each end time of the second cycle time tq1.

Thus, when viewed over a short period of time, sputtering in which the target voltage V is maintained constant is repeatedly performed and when viewed over a long period of time, the target voltage Vt becomes smaller downward and to the right and therefore sputtering is performed that takes changes in the deposition mode curve D1 into account.

In the first embodiment, the gas flow rate Q is adjusted such that the value of the target voltage V is brought closer to the value of the desired voltage Vt by monitoring the voltage V in the first cycle time tv, and the desired voltage Vt for the target voltage V is changed such that the value of the gas flow rate Q is brought closer to the value of the desired gas flow rate Qt by monitoring the gas flow rate Q in the second cycle time tq1. Thus, as well as sputtering in the transition mode T being performed with certainty, it is possible to maintain a certain sputtering state within the transition mode T. As a result, a compound thin film can be formed with a high deposition rate and consistent film quality.

It is preferable that the value of the gas flow rate Q be the value of the running average Qma of the gas flow rate monitored during the second cycle time tq1. By using the running average Qma of the gas flow rate, a stable value can be obtained for the desired voltage Vt without there being an influence from an unexpected measured value of the gas flow rate.

In addition, since an expensive plasma-emission monitor instrument is not employed in the first embodiment, a compound thin film having consistent film quality can be inexpensively formed.

Second Embodiment

A second embodiment relates to a thin film forming method in which a target current I is controlled while being monitored instead of the target voltage V described in the first embodiment. The same reactive sputtering device 10 described in the first embodiment is used when forming a thin film on the substrate 50. Although the target current I of the power supply is to be monitored, it is not possible to monitor a target current in the case of an RF power supply and therefore control using a target current is only possible in the case of a DC power supply. Description of parts that are the same as in the first embodiment will be omitted.

Figure 12:
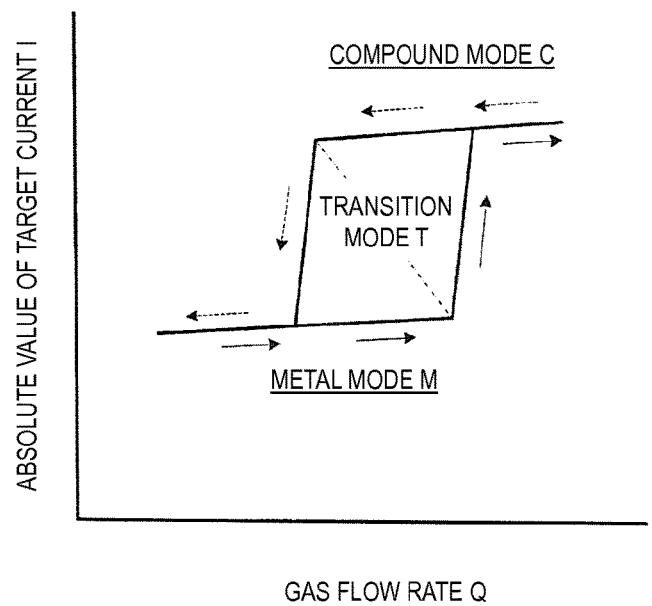
FIG. 12 is a diagram for explaining a deposition mode in reactive sputtering with the vertical axis representing the absolute value of a target current I being substituted for the vertical axis in FIG. 2.
Figure 13:
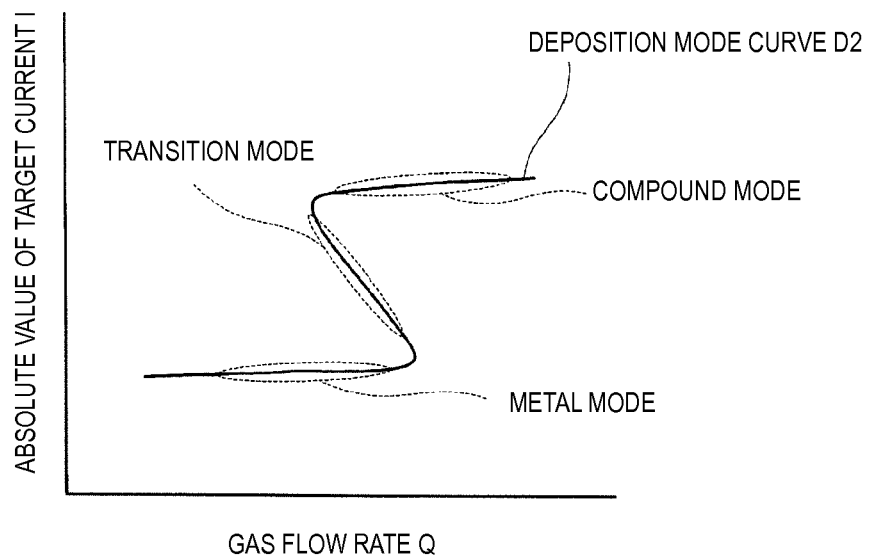
FIG. 13 is a diagram for explaining a deposition mode in reactive sputtering with the vertical axis representing the absolute value of a target current I being substituted for the vertical axis in FIG. 3.

FIGS. 12 and 13 are diagrams for explaining the deposition mode in reactive sputtering and illustrate the relationship between the absolute value of a target current I flowing to the metal target 13 and a gas flow rate Q of a reactive gas introduced into the inside of the vacuum chamber 11. In the case of constant power control, the target current I is expressed as the reciprocal of the target voltage V. Therefore, a deposition mode curve D2 is as illustrated in FIG. 13 and the metal mode (M), the compound mode (C) and the transition mode (T) are arranged as illustrated in FIG. 13.

FIG. 12 illustrates that the target current I changes as indicated by the solid line arrows when the gas flow rate Q is gradually increased, or the target current I changes as indicated by the broken line arrows when the gas flow rate Q is gradually decreased. Thus, the gas flow rate Q and the target current I in reactive sputtering have a hysteresis characteristic.

FIG. 13 illustrates the relationship between the gas flow rate Q and the target current I in the case where the gas flow rate Q is controlled in order to control the target current I to be constant. Although there are fluctuations in the gas flow rate Q and the target current I in reality, the gas flow rate Q and the target current I are illustrated as a curved line such as the deposition mode curve D2 by plotting average values of the gas flow rate Q and the target current I. When forming a thin film, sputtering is performed using any of the deposition conditions located along the deposition mode curve D2.

Figure 14:
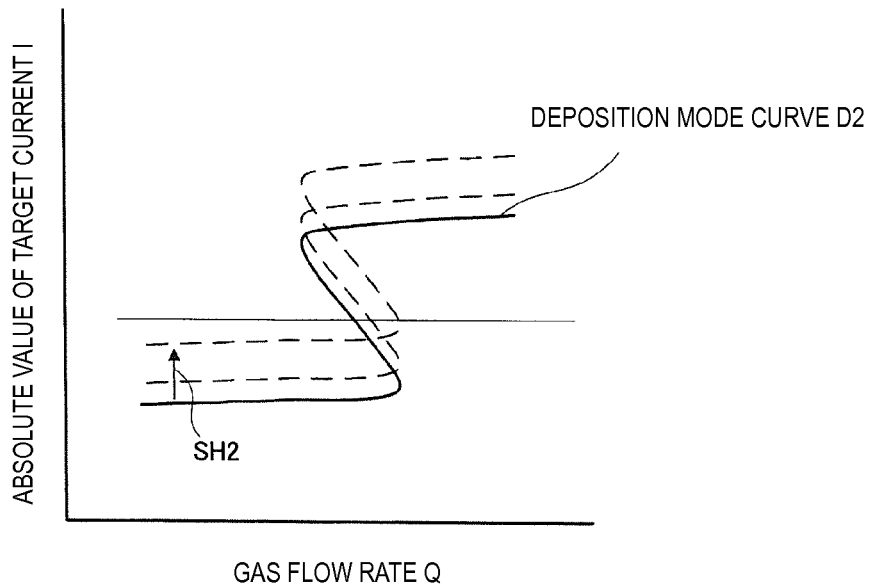
FIG. 14 illustrates a case in which the position of a deposition mode curve D2 illustrated in FIG. 13 is shifted upward with continuation of sputtering.

As illustrated in FIG. 14, the position of the deposition mode curve D2 shifts in the direction of an arrow SH2 (upward) over time. In the second embodiment, sputtering is controlled so as to take into account changes in the deposition mode curve D2 over time.

Figure 15:
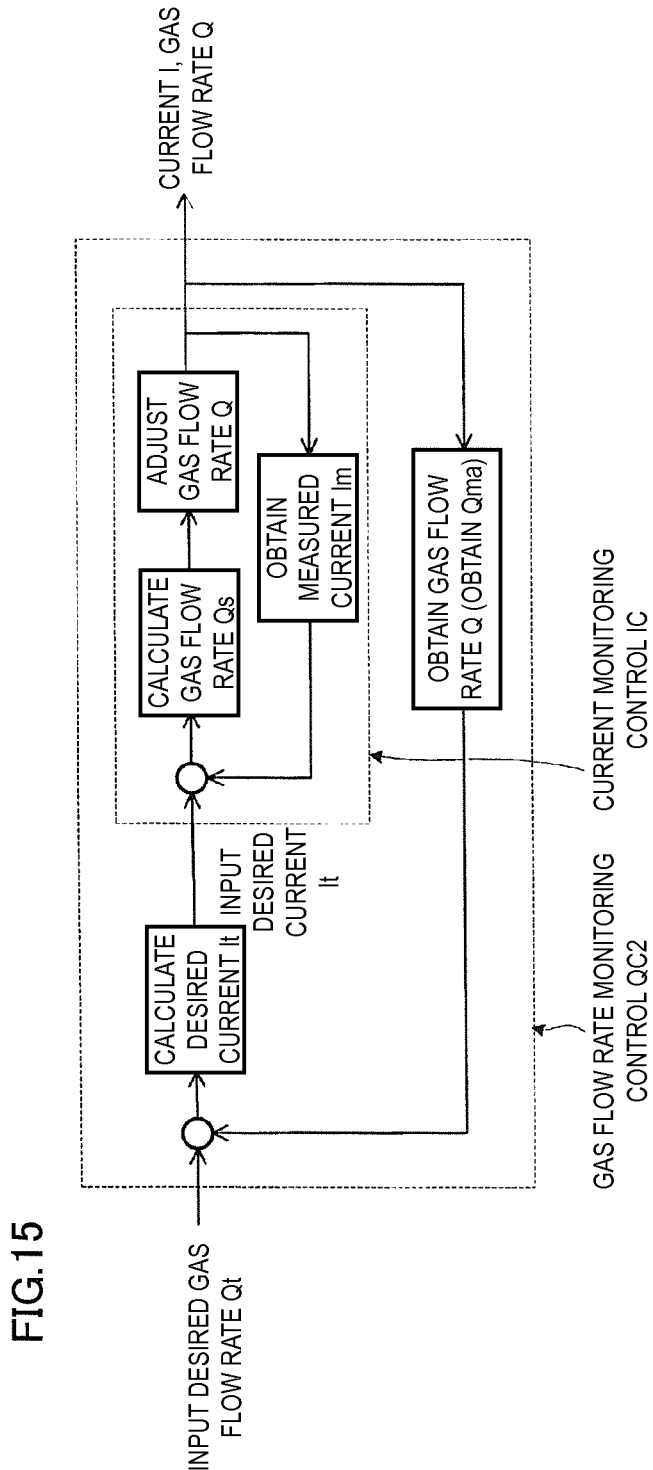
FIG. 15 is a block diagram for explaining a thin film forming method according to a second embodiment of the present disclosure.

The thin film forming method according to the second embodiment includes current monitoring control IC and gas flow rate monitoring control QC2 as illustrated in the block diagram of FIG. 15.

The current monitoring control IC is control in which the gas flow rate Q is adjusted such that the value of the target current I is brought closer to the value of a desired current It. In the current monitoring control IC, first, an input desired current It and a fed back measured current Im are compared. The desired current It is the target current I for performing thin film formation in the transition mode T and is initially set by obtaining data in advance regarding the target current I in the transition mode T. The measured current Im is a measured value obtained by monitoring the target current I when the reactive sputtering device 10 is made to operate.

Next, a calculated gas flow rate Qs is calculated in accordance with the difference between the desired current It and the measured current Im. As illustrated in FIG. 12, when the gas flow rate Q is caused to increase, the absolute value of the target current I becomes larger and when the gas flow rate Q is caused to decrease, the absolute value of the target current I becomes smaller. Therefore the calculated gas flow rate Qs is calculated such that the actual gas flow rate Q is caused to decrease when the measured current Im is larger than the desired current It and the actual gas flow rate Q is caused to increase when the measured current Im is smaller than the desired current It. For example, PID control is adopted in the calculation of the gas flow rate Qs.

The reactive gas introduction valve 15 is opened and closed in accordance with the obtained calculated gas flow rate Qs and the gas flow rate Q of the reactive gas introduced into the vacuum chamber 11 is thus adjusted. By adjusting the gas flow rate Q, the target current I is controlled so as to be maintained at the desired current It. The target current I, which is the output of the current monitoring control IC, is monitored once again, its value is fed back as the measured current Im and then compared with the desired current It. By repeatedly performing these steps, the target current I is maintained in a certain range and sputtering in the transition mode T is performed with certainty. The gas flow rate Q and the target current I fluctuate in reality, but control is performed in the transition mode T of the deposition mode curve D2 illustrated in FIG. 13 by taking the average values of the gas flow rate Q and the target current I.

A cycle time in which the current monitoring control IC is executed is extremely short and is for example 0.1 seconds. The current monitoring control IC is repeated a plurality of times continuously, and each time, control is performed so that the target current I is maintained at the desired current It. Hereafter, the cycle time in which the current monitoring control IC is executed will be referred to as "certain cycle time ti".

The gas flow rate monitoring control QC2 is control in which the desired current It for the target current I is changed so that the value of the gas flow rate Q is brought closer to the value of a desired gas flow rate Qt. The cycle time in which the gas flow rate monitoring control QC2 is executed is appropriately set so as to be longer than the certain cycle time ti and is for example between several tens of seconds and several hours. Hereafter, the cycle time in which the gas flow rate monitoring control QC2 is executed will be referred to as an "other cycle time tq2". The gas flow rate monitoring control QC2 is performed at every end time of the other cycle time tq2.

In the gas flow rate monitoring control QC2, first, the value of the input desired gas flow rate Qt and the value of the fed back gas flow rate Q are compared.

The desired gas flow rate Qt is a gas flow rate Q to be used when performing thin film formation in the transition mode T and is set by obtaining in advance data on the gas flow rate Q in the transition mode T.

Specifically, the fed back gas flow rate Q is a running average Qma of the gas flow rate monitored in the other cycle time tq2. The running average Qma of the gas flow rate is obtained by averaging the most recent values of the gas flow rate Q. Here, the period in which the running average Qma of the gas flow rate is obtained is longer than the certain cycle time ti and shorter than the other cycle time tq2. Hereafter, the period in which the running average Qma of the gas flow rate is obtained will be referred to as a "running average time ta".

Next, the desired current It is calculated in accordance with the difference between the desired gas flow rate Qt and the gas flow rate Q. The desired current It is calculated such that the value of the gas flow rate Q will be brought closer to the value of the desired gas flow rate Qt. Specifically, after using the running average Qma of the gas flow rate as the gas flow rate Q, the desired current It is calculated so as to become larger than its current value if the running average Qma of the gas flow rate is larger than the desired gas flow rate Qt and so as to become smaller than its current value if the running average Qma of the gas flow rate is smaller than the desired gas flow rate Qt. However, since the deposition mode curve D2 shifts upward when viewed over a long period of time, the desired current It is calculated so as to become larger with the passage of time. PID control is adopted in the calculation of the desired current It as well.

The obtained desired current It is input to the current monitoring control IC indicated by the broken line and as a result the value of the initially set desired current It is changed. The above-described current monitoring control IC is executed on the basis of the changed desired current It. In addition, when the gas flow rate Q has shifted from the desired gas flow rate Qt, the desired current It is corrected by the gas flow rate monitoring control QC2. By repeating these steps, the gas flow rate monitoring control QC2 is executed.

In the second embodiment, the gas flow rate Q is adjusted such that the value of the target current I is brought closer to the value of the desired current It by monitoring the current I in the certain cycle time ti, and the desired current It for the target current I is changed such that the value of the gas flow rate Q is brought closer to the value of the desired gas flow rate Qt by monitoring the gas flow rate Q in the other cycle time tq2. Thus, as well as sputtering in the transition mode T being performed with certainty, it is possible to maintain a certain sputtering state within the transition mode T. As a result, a compound thin film can be formed with a high deposition rate and consistent film quality.

It is preferable that the value of the gas flow rate Q be the value of the running average Qma of the gas flow rate monitored during the other cycle time tq2. By using the running average Qma of the gas flow rate, a stable value can be obtained for the desired current It without there being an influence from an unexpected measured value of the gas flow rate.

In addition, since an expensive plasma-emission monitor instrument is not employed in the second embodiment, a compound thin film having consistent film quality can be inexpensively formed.

The above-described embodiments do not limit the disclosures described in the claims and various modifications are possible within the scope in which identicalness of technical ideas is recognized. For example, voltage monitoring control or current monitoring control may be executed by changing the proportion of space occupied by the reactive gas by changing the flow rate of the non-reactive gas. In addition, gas flow rate monitoring control may be executed by making a ratio between a running average of the flow rate of the non-reactive gas and a running average of the flow rate of the reactive gas fall within a certain range.

The invention claimed is:

1. A thin film forming method for forming a thin film on a substrate arranged inside a vacuum chamber by using a reactive sputtering device, the thin film forming method comprising:
   providing a metal target inside the vacuum chamber,
   providing a power supply that supplies constant power to the metal target, and
   controlling a reactive gas introduction valve that adjusts a gas flow rate of a reactive gas introduced into the inside of the vacuum chamber, wherein,
   sputtering of a thin film is maintained in a transition mode of the thin film that lies between a metal mode and a compound mode, the sputtering comprising:
      executing, during a first cycle time, voltage monitoring control in which a target voltage, which is applied to the metal target, is monitored and the gas flow rate is adjusted so that a value of the target voltage is brought closer to a value of a desired voltage; and
      executing, during a second cycle time, gas flow rate monitoring control in which the gas flow rate is monitored and the desired voltage for the target voltage decreases at a completion of every second cycle time such that a value of the gas flow rate is brought closer to a value of a desired gas flow rate, wherein
   the second cycle time progresses simultaneously with the first cycle time but is longer than the first cycle time,
   the value of the gas flow rate is a running average of the gas flow rate monitored in the second cycle time, and
   the value of the gas flow rate increases throughout every second cycle time.

* * * * *